US005083136A

United States Patent [19]

Wells

[11] Patent Number: 5,083,136

[45] **Date of Patent: *Jan. 21, 1992**

[54] TRANSMISSION LINE COUPLING DEVICE WITH CLOSED IMPEDANCE MATCHING LOOP

[76] Inventor: Donald H. Wells, 1011 Wentworth Ave., Holland, Ohio 43528

[*] Notice: The portion of the term of this patent subsequent to Mar. 12, 2008, has been disclaimed.

[21] Appl. No.: 437,650

[22] Filed: Nov. 16, 1989

[51] Int. Cl.[5] ........................ H03H 11/28; H01Q 9/16

[52] U.S. Cl. .................................... 343/822; 343/860; 343/715; 333/24 C; 333/32; 333/33

[58] Field of Search ......................... 333/24 C, 32, 33; 343/715, 860–862, 856, 857, 816, 822, 829

[56] References Cited

U.S. PATENT DOCUMENTS

| | | | |
|---|---|---|---|
| 1,778,395 | 10/1930 | Lindenblad | 333/33 |
| 2,190,131 | 2/1940 | Alford | 333/33 X |
| 2,204,175 | 6/1940 | Carter | 343/822 |
| 2,226,686 | 12/1940 | Alford | 343/861 X |
| 2,448,036 | 8/1948 | Libby | 343/862 X |
| 2,829,367 | 4/1958 | Rychlik | 333/32 X |
| 4,238,799 | 12/1980 | Parfitt | 343/715 |
| 4,764,773 | 8/1988 | Larsen et al. | 333/32 X |
| 4,935,746 | 6/1990 | Wells | 343/703 |

*Primary Examiner*—Eugene R. LaRoche
*Assistant Examiner*—Benny T. Lee
*Attorney, Agent, or Firm*—William P. Hickey

[57] ABSTRACT

A transmission line coupling device comprising a pair of coils each having an electrical length of one half of the wave length of transmitted frequency. Respective ends of the coils are connected together to give a full wave loop. The outside shielding of the transmission cable is connected to one end of the coils so that the coils have generally ground potential at their ends. The midpoint of the coils have maximum voltage, and the center conductor of the transmission line is connected to a point on one coil having an impedance matching that of the transmission line. The other coil is capacitively coupled in some fashion to the antenna.

17 Claims, 3 Drawing Sheets

TRANSMISSION LINE COUPLING DEVICE WITH CLOSED IMPEDANCE MATCHING LOOP

TECHNICAL FIELD

The present invention relates to devices for coupling an alternating current transmission line to devices conductively isolated therefrom; and more particularly to a device for coupling a transmission line to an antenna.

BACKGROUND OF THE INVENTION

The present invention is an improvement on the invention described in my similarly entitled copending application Ser. No. 347,562, now U.S. Pat. No. 4,999,642 which is a continuation in part of parent application Ser. No. 162,633 now abandoned.

One of the problems encountered in high frequency handling devices is that sharp bends in conductors produces capacitance and/or inductances which create problems in tuning and reduced efficiencies. In order to package a conductive loop in as small a package as possible, the conductive loop must be bent at one or more places, and any movement between portions of the loop changes the tuned frequency of the device.

Accordingly, it is an object of the present invention to package a closed loop having an electrical length of a full wave length of transmitted frequency in as small a space as possible without unsymmetrical bends or spacings.

It is a further object of the invention to produce a device of the above described type which can couple to a antenna that requires no ground.

A still further object of the invention is the provision of a new and improved coupler between a transmission line and antenna which is rugged in construction, inexpensive to manufacture, and efficient in its operation.

Further objects and advantages will become apparent to those skilled in the art to which the invention relates from the following description of the preferred embodiments described with reference to the accompanying drawings forming a part of this specification.

BRIEF SUMMARY OF THE INVENTION

The coupling device of the present invention comprises a pair of coils, each having an electrical length equal to approximately one half of the transmitted wave length. The top of the coils are connected together, and the bottom of the coils are connected to the outside conductor of a coaxial cable that is usually at ground potential. Because each coil is a half wave length, a half wave is produced in each coil with zero voltage at its opposite ends and a maximum voltage at its center. Somewhere between its end and center will be an impedance that matches that of the transmission line, and the center conductor of the transmission line is connected to this point. An antenna of any impedance can be coupled to one of the coils at a point having the antenna's impedance. This can be accomplished by direct connection or through a capacitor by having one plate of the capacitor attached to the coil at the proper impedance point, and the other plate attached to the antenna. However, the individual coils have appreciable capacitance, and particularly where the antenna is a coiled conductor there will be sufficient capacitance that the coil can be capacitively coupled directly to the antenna. In the case of a half wave length antenna that is open at both ends, it will have maximum alternating voltage at its ends, In this case, the lower end of the antenna can be positioned close to one of the coils to provide the necessary capacitive coupling. With such a full wave loop, the antenna needs no grounding.

It has been found that the tuned frequency at which a wave is produced can be adjusted by varying the spacing or interaction between the two coils. As they are moved closer together, the tuned frequency can be decreased. Because of the inductance provided by the coils, the tuned circuit can be made to have a high quality, "Q" or gain. The band pass can be increased or decreased by increasing or decreasing the spacing of the individual wraps of the coils. One of the flat coils can be positioned on one side of the window of an automotive vehicle and the metal capacitor plate of the antenna can be adhered to the window opposite the flat coil for capacitive coupling therewith.

DESCRIPTION OF THE PREFERRED EMBODIMENTS

The present invention is an improvement over the invention described in my U.S. application Ser. No. 347,562 now U.S. Pat. No. 4,999,642 in that it eliminates nonsymmetrical bends which give unwanted impedance; it can eliminate the need for a ground at the antenna; and it gives a higher gain to the antenna.

Figure 1:
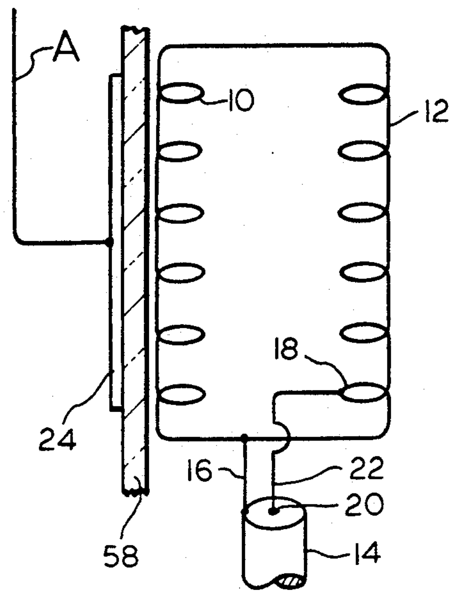
FIG. 1 is a schematic view of one embodiment of the invention.

The embodiment shown in FIG. 1 comprises coils 10 and 12 each of which have an electrical length equal to one half of the transmitted frequency. The top of coils 10 and 12 are connected together, as is the bottom of the coils, to form a closed loop having an electrical length equal to a full wave length. A coaxial transmission line 14 has its outside shield connected to the bottom of the coils 10 and 12 by the conductor 16.

As explained in U.S. Pat. No. 4,999,642, the ends of the loop have maximum current and low voltage, and the center of the legs (in this case coils 10 and 12) have maximum voltage. As explained in U.S. Pat. No. 4,999,642, there is substantially zero impedance in the loop at the points having maximum current and low voltage, and maximum impedance at the points having no current and maximum voltage. Somewhere between the points of low voltage and maximum voltage is a point 18 having an impedance matching the center conductor 20 of the coaxial cable, and point 18 is connected to center conductor 20 by conductor 22.

In my previous application, the output from the loop was connected to one plate of an antenna coupling capacitor, the other plate 24 of which was connected to the antenna A located externally of a glass windshield 58. Because the legs of the present loop are coils, coil 10 has a sufficiently concentrated capacitance that it can serve as the transmission line plate of the antenna coupling capacitor.

Figure 4:
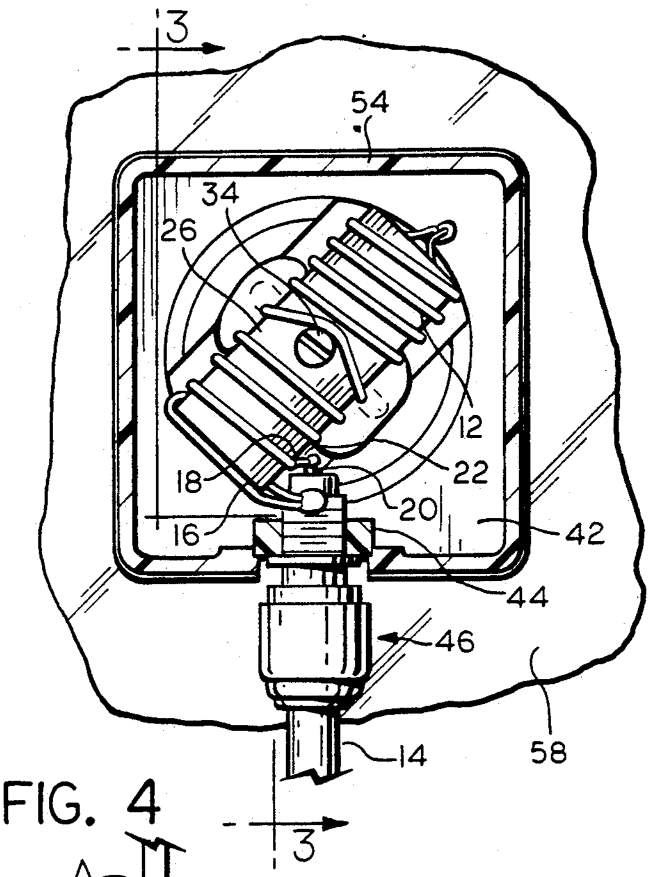
FIG. 4 is a sectional view taken on the line 4—4 of FIG. 3.
Figure 2:
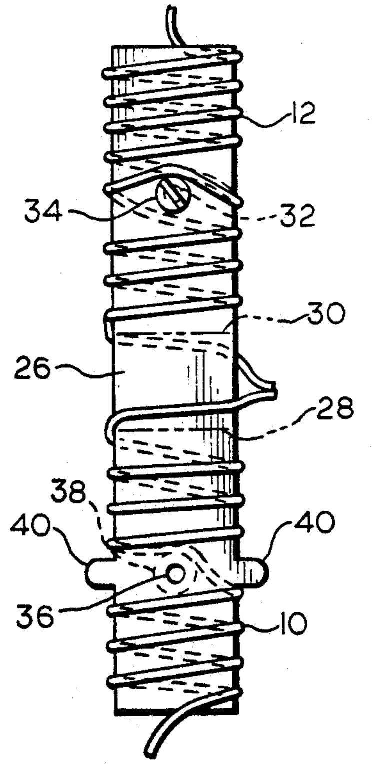
FIG. 2 is a plan view of a flat coil form used in the embodiment of FIG. 1.
Figure 3:
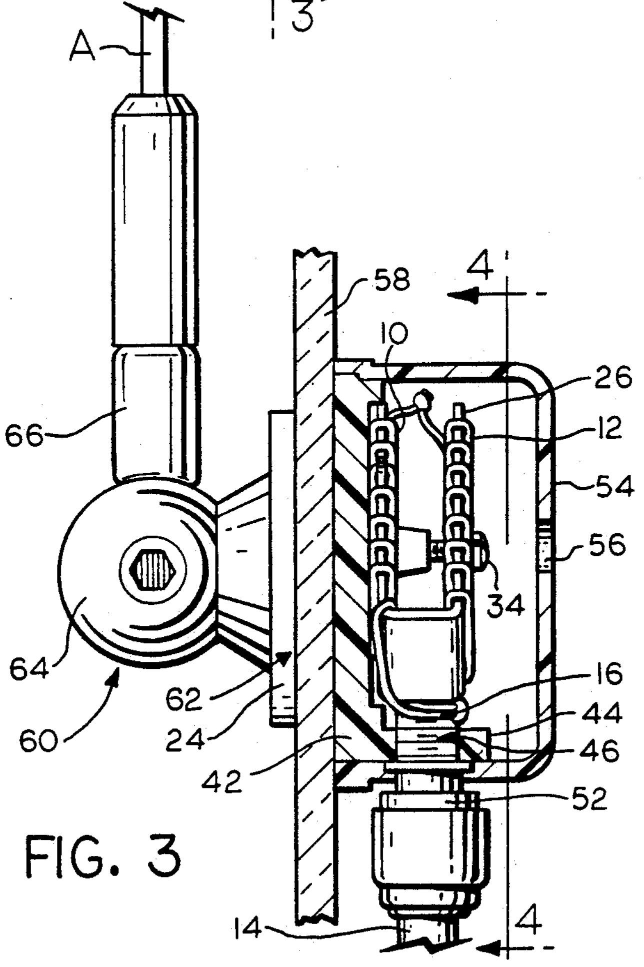
FIG. 3 is an elevational view with the cover broken away along the line 3—3 of FIG. 4 to show the internal parts of a first embodiment corresponding to FIG. 1.

FIG. 2 is a plan view of the wound coil form of the embodiment shown in FIGS. 3 and 4. The coil form 26 is a flat plastic strip having bend grooves 28 and 30 across its bottom side. The coil form includes a hole 32 there through for receiving a machine screw 34 for threading into a hole 36 in the opposite half of the coil form when the coil form is bent into a U-shape. A boss 38 surrounds the hole 36 to give added reinforcement. The coils 10 and 12 are formed by a continuous winding with the coil 10 being totally below groove 28 and coil 12 being totally above groove 30. On opposite sides of hole 36 are a pair of ears 40 for holding the coil form in position as will later be explained.

As best seen in FIG. 3, the coil form 26 is bent into a U-shape and is held in this position by machine screw 34. The leg of the form containing coil 10 is cemented onto a plastic base 42, and the ears 40 are fused onto the base 42 to secure the coil form in position. The base 42 includes a pedestal 44 having a coaxial cable connector 46 extending there through. The center terminal 20 of the cable connector 46 is connected to the point 18 (not seen in FIG. 3) on coil 12 which has an impedance matching that of the coaxial cable 14 that is connected to the coaxial cable connector 46. Conductor 16 connects the outside barrel 52 of the connector to the portion of the conductor which connects coils 10 and 12. A cover 54 is cemented to the base 42 to protect the coils. Cover 54 has a hole 56 there through opposite screw 34 to permit the screw to be adjusted for reasons which will later be explained.

One use of the invention is to communicate RF signals through the windshields of automobiles between an antenna on the outside, and a receiver or transmitter on the inside. FIGS. 3 and 4 show the base 42 cemented to the inside of a glass windshield 58. On the outside of the windshield 58 is a metal antenna support 60 (See FIG. 3). The antenna support 60 has a metal base 62 that is cemented to the windshield opposite the coil 10. The base has a pedestal 64 thereon to which is rotatably clamped an internally threaded barrel 66 into which the antenna A is threaded.

After the antenna system is in place, the screw 34 can be tightened to bend coil 12 toward coil 10 to increase the intercapacitance between the coils and thereby lower the tuned frequency of the coupling.

Figure 5:
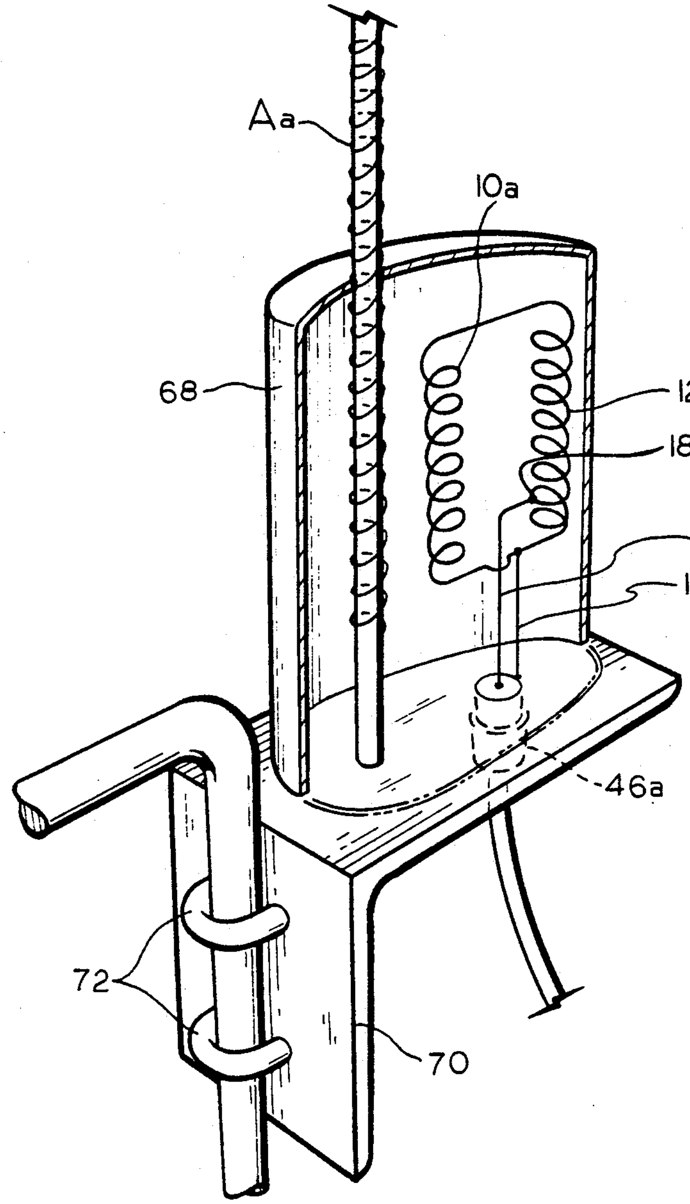
FIG. 5 is a schematic isometric view, with the cover broken away, of another embodiment of the invention.

The embodiment shown in FIG. 5 is generally similar to the embodiment previously described, but differs principally therefrom in that the antenna Aa is directly capacitively coupled to coil 10*a* without the intermediary of a separate capacitor plate. Those portions of the embodiment shown in FIG. 5 which are similar to corresponding portions of the embodiment shown in FIGS. 1 through 4 are designated by a like reference numeral characterized further in that a suffix "a" is affixed thereto. The antenna Aa is fixed to a streamlined plastic housing 68 opposite and in close proximity to the coil 10*a*. The housing 68 is cemented to a section of aluminum angle 70 which in turn is fixed to a truck mirror bracket by a pair of U-clamps 72. In this case tuning can be accomplished by raising or lowering the coiled portion of antenna Aa relative to coil 10*a* of the transmission line coupling.

Figure 6:
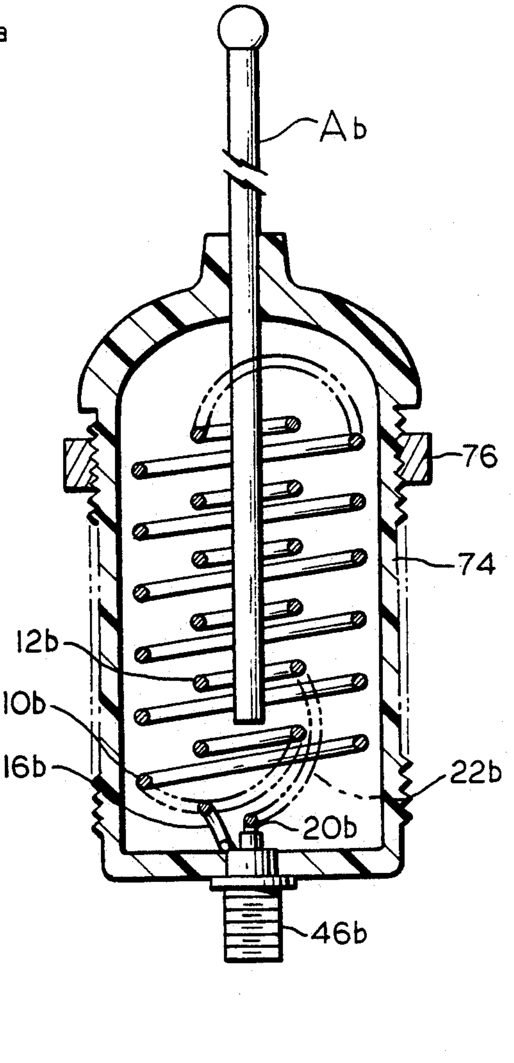
FIG. 6 is a somewhat schematic sectional view of another embodiment of the invention.

The embodiment shown in FIG. 6 is generally similar to the previously described embodiments, but differs principally in that the coils are coaxial with one of the coils being mounted within the other coil. Those portions of FIG. 6 which correspond to similar portions of the other embodiments are designated by a like reference numeral except that a suffix "b" is affixed thereto.

As in the previously described embodiments the coils 10*b* and 12*b* each have an electrical half wave length and are connected together at the top by a conductor lying above the plane of FIG. 6 and shown by dot-dash lines. The coils 10*b* and 12*b* are also connected together at the bottom by a conductor lying above the plane of FIG. 6 and shown by dot-dash lines.

The coils are potted together in a manner providing a housing 74 into which the coaxial transmission line connector 46*b* is molded at the bottom and the antenna Ab is retained at the top. The antenna Ab extends down into the center of coil 12*b* by a distance sufficient to capacitively couple it with the coil 12*b*. In the present embodiment, tuning of the circuit is accomplished by an electrically conductive ring 76 that is threaded onto the housing 74 in such manner that it can be positioned longitudinally of the magnetic field produced by coils 10*b* and 12*b*. By moving ring 76 into the fields, the mutual inductance of the coils is decreased by the induced current that travels around ring 76 thereby increasing the tuned frequency of the transmission line coupling device.

When the ring 76 is moved upwardly out of the magnetic fields of the coils, a reduced current is induced in ring 76 and in turn a smaller opposing magnetic field is produced by the ring to decrease the tuned frequency of the device.

Figure 7:
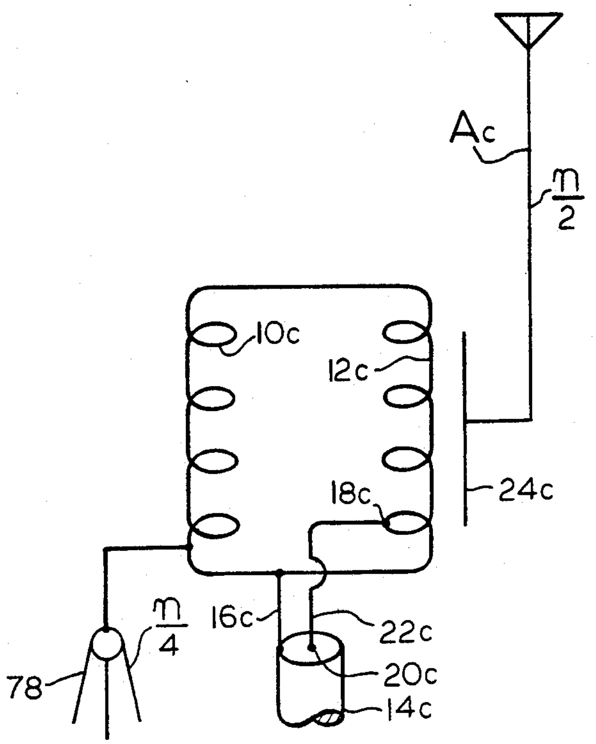
FIG. 7 is a schematic view of an embodiment that includes a quarter wave length ground plane.

The embodiment shown in FIG. 7 is similar to the embodiment shown in FIG. 1, but differs principally in that a second antenna element is connected to the loop in a position to provide a quarter wave length (n/4) ground plane. Those portions of the antenna shown in FIG. 7 which correspond to portions of the embodiment shown in FIG. 1 are designated by a like reference numeral characterized further in that a suffix "c" is attached thereto.

In the embodiment shown in FIG. 7 a half wave length (n/2) antenna element Ac is capacitively coupled to the coil 12*c* and so is voltage fed. The oscillations in the half wave length antenna Ac will be in timed relation to the oscillations in coil 12*c*. A quarter wave length antenna element 78 is conductively connected to coil 10*c* and so is current fed. Because a ground plane is desired, it is made as a ring having legs extending downwardly and outwardly and the ring and leg assembly will usually be mounted coaxially around the transmission line 14*c*. Coils 10*c* and 12*c* can be identical to those shown in FIGS. 1-4 and can be tuned in the same manner by using a screw to move the coils toward and away from each other.

Figure 8:
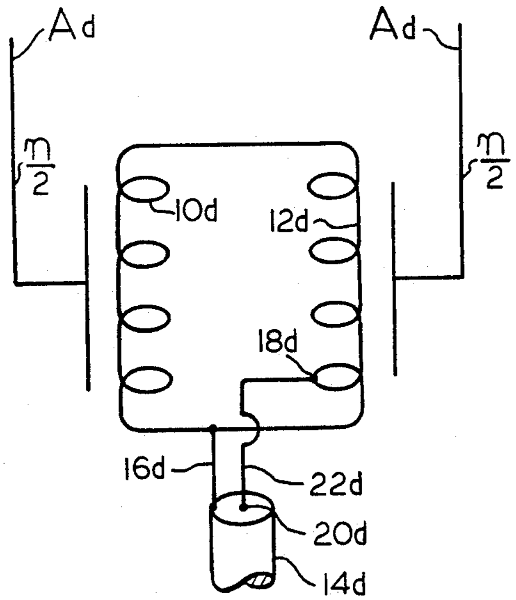
FIG. 8 is a schematic view of an embodiment that drives a balanced full wave antenna.

The embodiment shown in FIG. 8 is similar to the embodiment shown in FIG. 1 but differs principally in that two half wave length (n/2) antenna elements Ad are coupled to the loop. Those portions of the embodiment shown in FIG. 8 are designated by the same reference numerals shown in FIG. 1 excepting that a suffix "d" is affixed thereto. The two antenna elements Ad are capactively coupled to the opposite coils at the proper impedance and so each is voltage fed.

Figure 9:
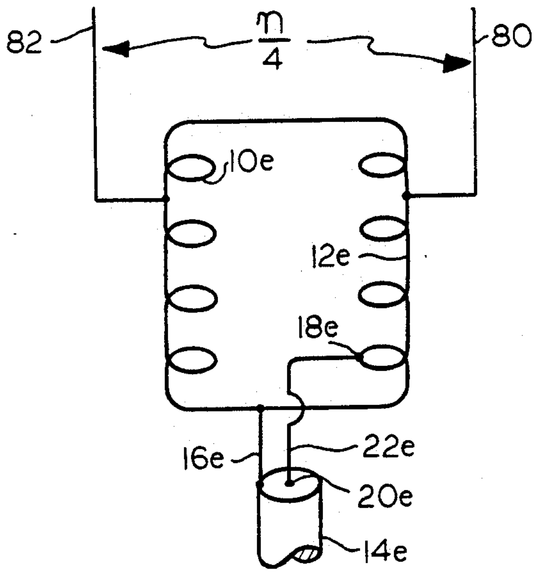
FIG. 9 is an embodiment that drives two quarter wave length antenna elements in a balanced half wave configuration.

The embodiment shown in FIG. 9 is generally similar to the embodiment shown in FIG. 1 but differs principally in that two quarter wave length (n/4) antenna elements 80 and 82 are conductively coupled to coils **12*e* and 10*e*** respectively. Those portions of the embodiment shown in FIG. 9 which correspond to similar portions of FIG. 1 are designated by a like reference numeral characterized further in that a suffix "e" is affixed thereto.

It should also be pointed out that applicant's invention allows any wave length antenna element (such as $\frac{5}{8}$ wave length etc.) to be driven by the loop by coupling the antenna element to the proper impedance point of applicant's loop.

While the invention has been described in considerable detail, I do not wish to be limited to the particular embodiments shown and described, and it is my intention to cover hereby all novel adaptations, modifications, and arrangements thereof which come within the pactice of those skilled in the art to which the invention relates, and which come within the purview of the following claims.

I claim:

1. Coupling means for transmitting a signal of generally predetermined frequency and wave length between a two element transmission line of characteristic impedance and a first conductor of given impedance, said means comprising: first and second coils with each coil having first and second opposite ends and with respective first and second ends being directly connected to each other to form a closed loop; first means for connecting a first element of said two element transmission line to a first point on said first coil spaced apart from its second end; second means for connecting a second element of said two element transmission line to said first end of said second coil to cause said signal to travel directly through both coils between said first and second means and produce a range of impedance points around said loop, and said first and second means being disposed on said loop at points having said characteristic impedance there between; and means for coupling said first conductor to said loop, said means for coupling being disposed at a point providing said given impedance to said first conductor.

2. The coupling means of claim 1 wherein said first conductor is an antenna.

3. The coupling means of claim 1 including means for spacing said first and second coils of said pair of coils from each other, and means for varying said spacing of said coupling means to vary the predetermined frequency.

4. The coupling means of claim 1 wherein each one of said coils is coiled around a form having a width and a thickness, with the width of each form being greater than said thickness and in which the width of the forms generally face each other thereby providing desired mutual capacitance.

5. The coupling means of claim 4 wherein said form is a generally U-shaped flexible member having opposing spaced apart legs defining a spacing therebetween, and with said coils being coiled on said opposing spaced apart legs, and said legs being spaced apart by a threaded fastener constructed and arranged to change said spacing between said legs.

6. Coupling means for transmitting a signal of generally predetermined frequency and wave length between a two element transmission line of characteristic impedance and a first conductor of given impedance, said means comprising: a flat strip having a generally U-shaped with generally parallel legs having a spacing therebetween; an electrically conductive loop having opposite portions coiled around respective ones of said generally parallel legs, said loop accommodating a wave of said signal; a first transmission line terminal connected to said loop between said legs; a second transmission line terminal connected to one of said coiled portions of said loop and which is spaced apart from said first terminal by a distance to provide said characteristic impedance between said terminals; and electrically conductive means of given impedance isolated from said loop but positioned adjacent one of said opposite coiled portions for capacitively coupling with said opposite one of said coiled portions of said loop.

7. The coupling means of claim 6 including a first housing supporting said U-shaped strip and said loop wound thereon.

8. The coupling means of claim 7 wherein said coils are mounted in said housing and a screw extends through said legs of said U-shaped strip for moving said legs toward each other.

9. The coupling means of claim 6 including tuning means for adjusting the spacing of said legs.

10. A device for coupling a signal of generally predetermined wave length from a transmission line on one side of a dielectric plate to an antenna on another side of said dielectric plate, said device comprising: a generally U-shaped coil form having flattened generally parallel spaced apart legs located on said one side of said dielectric plate; a closed loop conductor with opposite portions coiled around respective ones of said legs; a housing for supporting said coil form, and said closed loop conductor coiled thereon, to said one side of the dielectric plate; and a conductive plate adapted to be secured to said another side of the dielectric plate opposite said housing.

11. The device of claim 10 including tuning means for adjusting the spacing between said legs of said U-shaped form.

12. A coupling device for transmitting a signal of generally predetermined wave length between a transmission line of characteristic impedance and an antenna of given impedance, comprising: a conductor having first and second opposite ends and intermediate portions coiled into first and second coils, said first coil being connected to said first end and said second coil being connected to said second end to provide a loop with direct continuity there between and with both ends of said conductor being connected together; a first transmission line terminal connected to said second end of said conductor; a second transmission line terminal connected to a point on said first coil spaced apart from said second coil and which has said characteristic impedance with respect to said first terminal; and an antenna drive element electrically isolated from said loop but capacitively coupled to one of said first and second coiled portions of said loop.

13. The device of claim 12 including means for adjusting a spacing between said first and second would portions of said loop.

14. The device of claim 12 wherein said antenna element is a portion of a half wave length radiator.

15. The coupling means of claim 1 wherein said first conductor is a half wave length antenna element coupled to one of said coils; and said coupling means further including a ground plane antenna element coupled to the other of said coils.

16. The coupling means of claim 1 wherein said first conductor is an antenna element coupled to one of said coils; said coupling means further including: a second antenna element coupled to the other of said coils.

17. The coupling means of claim 1 wherein said first conductor is a quarter wave length antenna element conductively coupled to one of said coils, and said coupling means further including; a second quarter wave length antenna element conductively coupled to the other of said coils.

* * * * *